United States Patent
Chen

(10) Patent No.: US 10,211,150 B2
(45) Date of Patent: Feb. 19, 2019

(54) MEMORY STRUCTURE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 152 days.

(21) Appl. No.: 14/845,304

(22) Filed: Sep. 4, 2015

(65) Prior Publication Data

US 2017/0069567 A1 Mar. 9, 2017

(51) Int. Cl.

| H01L 23/528 | (2006.01) |
|---|---|
| H01L 29/792 | (2006.01) |
| H01L 29/788 | (2006.01) |
| H01L 27/115 | (2017.01) |
| G11C 16/18 | (2006.01) |
| H01L 27/11519 | (2017.01) |
| H01L 27/11556 | (2017.01) |
| H01L 27/11521 | (2017.01) |
| H01L 27/11565 | (2017.01) |
| H01L 27/11568 | (2017.01) |
| H01L 27/11582 | (2017.01) |
| G11C 16/08 | (2006.01) |

(52) U.S. Cl.
CPC ............ H01L 23/528 (2013.01); G11C 16/08 (2013.01); H01L 27/11519 (2013.01); H01L 27/11521 (2013.01); H01L 27/11556 (2013.01); H01L 27/11565 (2013.01); H01L 27/11568 (2013.01); H01L 27/11582 (2013.01); H01L 29/7889 (2013.01); H01L 29/7926 (2013.01)

(58) Field of Classification Search
CPC ............ H01L 29/7926; H01L 29/7889; H01L 29/7827; H01L 29/66666; H01L 29/78642; H01L 27/0688; H01L 27/11551; H01L 21/8221; H01L 27/11578; H01L 45/01
See application file for complete search history.

(56) References Cited

U.S. PATENT DOCUMENTS

| 8,089,120 B2 | 1/2012 | Tanaka et al. | |
|---|---|---|---|
| 2001/0009519 A1* | 7/2001 | Fujisawa | G11O 5/025 365/51 |
| 2009/0267128 A1* | 10/2009 | Maejima | H01L 27/11565 257/314 |
| 2011/0115010 A1* | 5/2011 | Shim | H01L 27/11565 257/314 |
| 2014/0183756 A1* | 7/2014 | Hwang | H01L 29/7889 257/774 |
| 2015/0263024 A1* | 9/2015 | Hishida | H01L 21/82343 257/329 |

* cited by examiner

Primary Examiner — Tom Thomas
Assistant Examiner — John Bodnar
(74) Attorney, Agent, or Firm — McClure, Qualey & Rodack, LLP

(57) ABSTRACT

A memory structure is provided. The memory structure comprises M array regions and N contact regions. M is an integer ≥2. N is an integer ≥M. Each array region is coupled to at least one contact region. Each contact region comprises a stair structure and a plurality of contacts. The stair structure comprises alternately stacked conductive layers and insulating layers. Each contact is connected to one conductive layer of the stair structure. Two array regions which are adjacent to each other are spatially separated by two contact regions, which are coupled to the two array regions, respectively.

15 Claims, 5 Drawing Sheets

MEMORY STRUCTURE

TECHNICAL FIELD

This disclosure relates to a semiconductor structure, and more particularly to a memory structure.

BACKGROUND

Semiconductor devices have become denser and smaller. Various three-dimensional (3D) memory structures, going with the trend, have been developed. For many kinds of the 3D memory structures, some improvements are still possible, so as to achieve benefits of lower RC delay, reduced overhead time, easier manufacturing processes, lower cost, and the like.

SUMMARY

The disclosure is directed to a memory structure. According to some embodiments, the memory structure comprises M array regions and N contact regions. M is an integer ≥2. N is an integer ≥M. Each of the M array regions is coupled to at least one of the N contact regions. Each of the N contact regions comprises a stair structure and a plurality of contacts. The stair structure comprises alternately stacked conductive layers and insulating layers. Each of the contacts is connected to one of the conductive layers of the stair structure. Two of the M array regions which are adjacent to each other are spatially separated by two of the N contact regions, which are coupled to the two of the M array regions, respectively.

Figure 1:
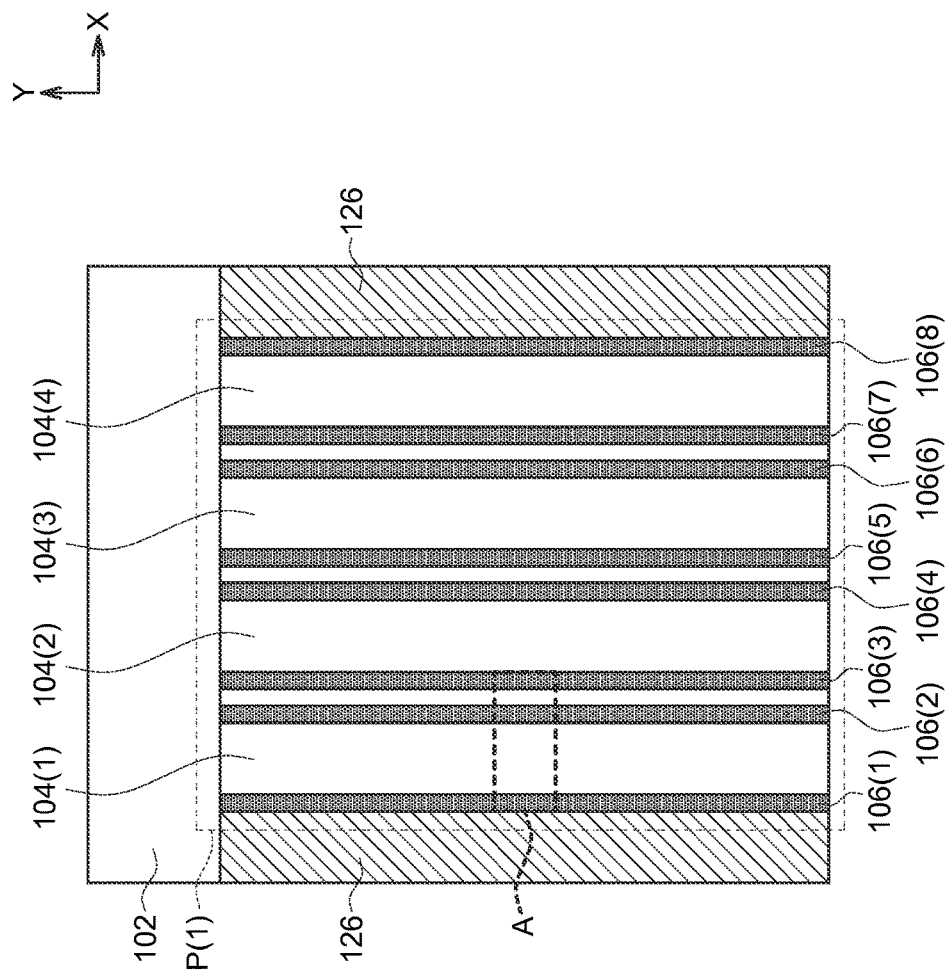
FIG. 1 shows a memory structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. It is noted that, for clarity, the relative sizes of elements shown in the figures may not be the same as their real relative sizes.

The memory structure according to embodiments of this disclosure comprises M array regions and N contact regions. M is an integer ≥2. N is an integer ≥M, preferably, N>3, and more preferably, N>7. Each of the M array regions is coupled to at least one of the N contact regions. Each of the N contact regions comprises a stair structure and a plurality of contacts. The stair structure comprises alternately stacked conductive layers and insulating layers. Each of the contacts is connected to one of the conductive layers of the stair structure. Two of the M array regions which are adjacent to each other are spatially separated by two of the N contact regions, which are coupled to the two of the M array regions, respectively.

Referring to FIG. 1, a memory structure according to one embodiment is shown. In this embodiment, M=4, and N=8. As shown in FIG. 1, array regions 104(1) to 104(4) and contact regions 106(1) to 106(8) may be disposed on a substrate 102 of the memory structure. Here, N=2M, and every two of the contact regions 106(1) to 106(8) are disposed on two sides of corresponding one of the array regions 104(1) to 104(4). For example, the two contact regions 106(1) and 106(2), which are coupled to the array region 104(1), are disposed on two sides of the array region 104(1). The two contact regions 106(3) and 106(4), which are coupled to the array region 104(2), are disposed on two sides of the array region 104(2). The two contact regions 106(5) and 106(6), which are coupled to the array region 104(3), are disposed on two sides of the array region 104(3). Similarly, the two contact regions 106(7) and 106(8), which are coupled to the array region 104(4), are disposed on two sides of the array region 104(4). Two array regions which are adjacent to each other are spatially separated by two contact regions, which are coupled to the two array regions, respectively. For example, the array regions 104(1) and 104(2) are spatially separated by the contact regions 106(2) and 106(3). The array regions 104(2) and 104(3) are spatially separated by the contact regions 106(4) and 106(5). The array regions 104(3) and 104(4) are spatially separated by the contact regions 106(6) and 106(7). The memory structure may further comprise two decoders 126, such as X-decoders, wherein the array regions 104(1) to 104(4) and the contact regions 106(1) to 106(8) are disposed between the two decoders 126.

Figure 2:
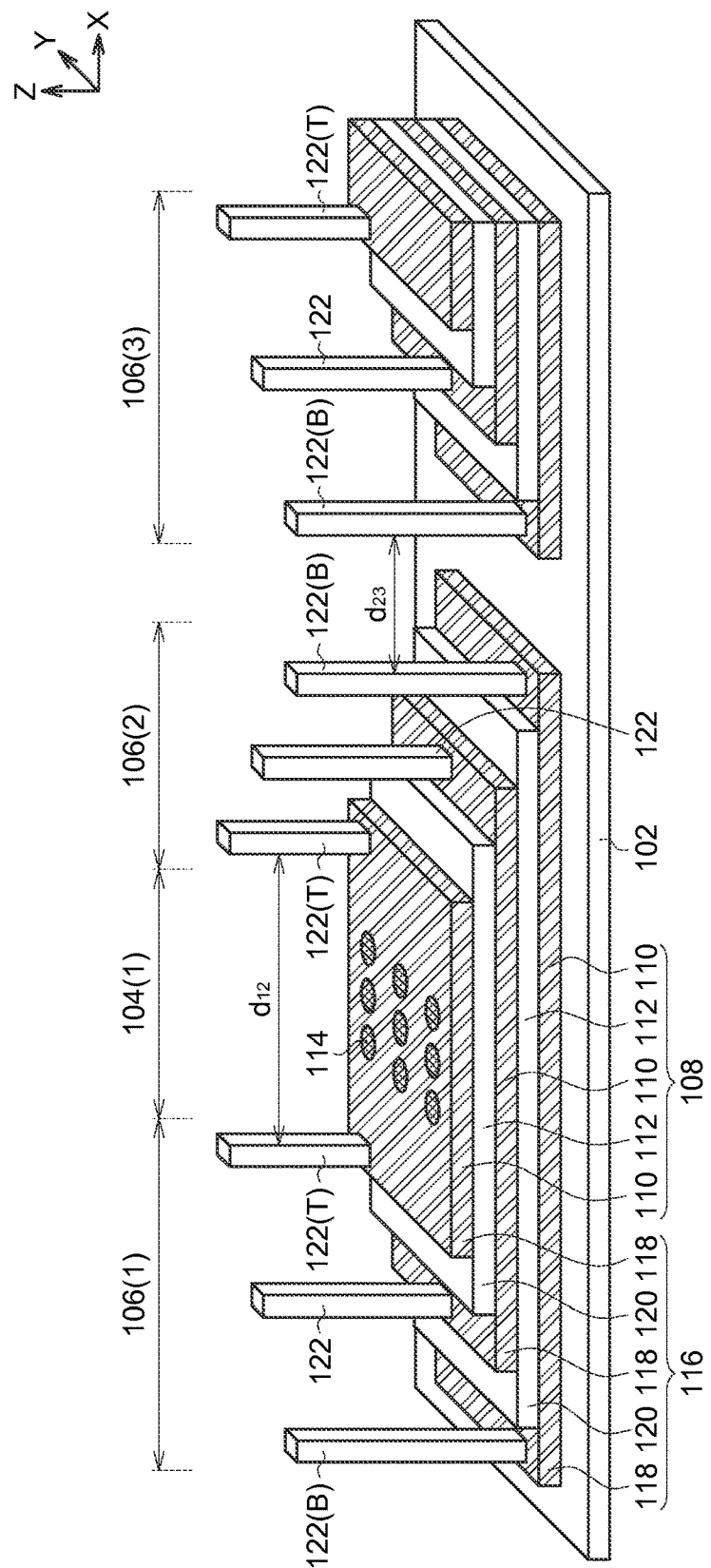
FIG. 2 and FIG. 3 show perspective views illustrating the components in region A of FIG. 1.

The exemplarily detailed structures of an array region and a contact region are illustrated in FIG. 2. In FIG. 2, only portions of the array region 104(1) and the contact regions 106(1) to 106(3) that are in the region A of FIG. 1 are shown, and the description will be mainly focused on the array region 104(1) and the contact region 106(1). In spite of this, other array regions and contact regions may have similar configurations. According to FIG. 2, the memory structure may be applied to a 3D vertical channel NAND memory, but the disclosure is not limited thereto.

Referring to FIG. 2, the array region 104(1) may comprise a stack 108 and a plurality of strings 114. The stack 108 comprises alternately stacked conductive layers 110 and insulating layers 112, and may be disposed on the substrate 102. The conductive layers 110 may be made of metal, heavily-doped silicon or the like, wherein the heavily-doped silicon may comprise a n-type or p-type dopant with a doping concentration higher than $10^{20}$ cm$^{-3}$. The stack 108 may extend in a X-direction, and the conductive layers 110 in the stack 108 can be used as word lines. The array region 104(1) may comprise a plurality of blocks, which are defined by the word line layers. The strings 114 penetrate through the stack 108. As such, a plurality of memory cells can be formed at cross portions of the strings 114 and the conductive layers 110. Further, a plurality of string select lines (not shown) and a plurality of bit lines (not shown) may be disposed over and connected to the strings 114, wherein the string select lines may extend in the X-direction, and the bit lines may extend in a Y-direction.

The contact region 106(1) comprises a stair structure 116 and a plurality of contacts 122. The stair structure 116 comprises alternately stacked conductive layers 118 and insulating layers 120, and may be disposed on the substrate 102. The conductive layers 118 may be made of metal, heavily-doped silicon or the like, wherein the heavily-doped silicon may comprise a n-type or p-type dopant with a doping concentration higher than $10^{20}$ cm$^{-3}$. The stair structure 116 of each of the contact regions 106(1) to 106(8) and the stack 108 of corresponding one of the array regions 104(1) to 104(4) may be continuously formed. More specifically, the stack 108 and the stair structure 116 may be made of the same materials by the same manufacturing processes. Each contact 122 is connected to one of the conductive layers 118.

Figure 3:
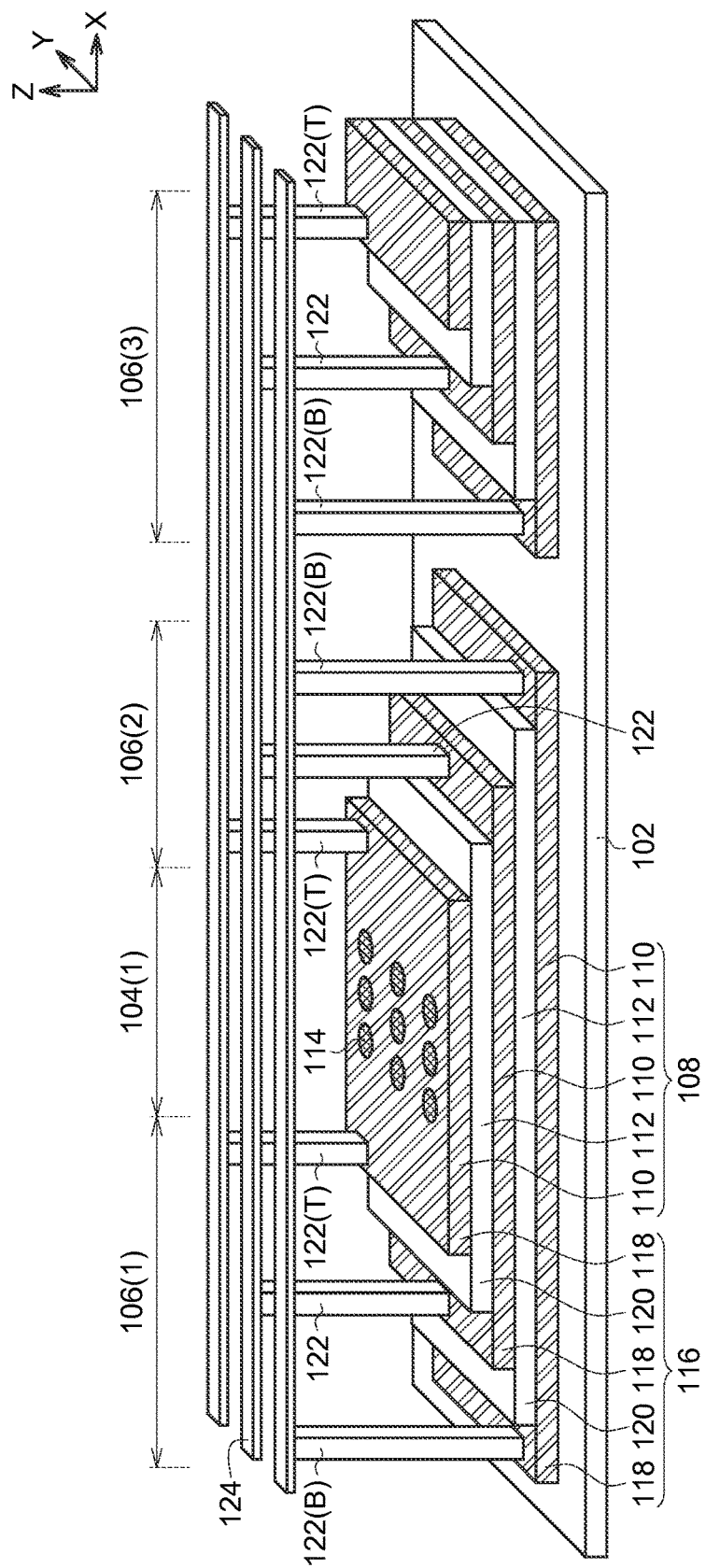

The two contact regions separating two adjacent array regions are electrically connected to each other but at least partially spatially separated from each other. For example, as shown in FIG. 3, contacts 122 of different contact regions (in FIG. 3, only contact regions 106(1) to 106(3) are shown) may be connected by conductive lines 124 disposed over the array regions and the contact regions. More specifically, the contacts 122 connected to the conductive layers 118 at the same level are connected by the same conductive line 124. The conductive lines 124 may be made of a material having high conductivity, such as metal. In the embodiments shown in FIG. 2 and FIG. 3, the contact regions 106(2) and 106(3) are completely spatially separated from each other. Alternatively, the contact regions 106(2) and 106(3) may be partially spatially separated from each other. For example, the conductive layers 118 at lower levels may not be separated.

Now referring to both FIG. 1 and FIG. 2, specifically, the N contact regions may comprise an $i^{th}$ contact region, an $(i+1)^{th}$ contact region, a $j^{th}$ contact region and a $(j+1)^{th}$ contact region, wherein i is an odd number from 1 to N−1, and j is an even number from 2 to N−2. The $i^{th}$ contact region and the $(i+1)^{th}$ contact region may be disposed mirror-symmetrically, and the $j^{th}$ contact region and the $(j+1)^{th}$ contact region may be disposed mirror-symmetrically. For example, the first contact region 106(1) and the second contact region 106(2) are disposed mirror-symmetrically, and the second contact region 106(2) and the third contact region 106(3) are disposed mirror-symmetrically. The N contact regions may have a distance $d_{i(i+1)}$ between the $i^{th}$ contact region and the $(i+1)^{th}$ contact region and a distance $d_{j(j+1)}$ between the $j^{th}$ contact region and the $(j+1)^{th}$ contact region. The distance between two adjacent contact regions is defined as the distance between a closest pair of contacts 122. For example, as shown in FIG. 2, the distance $d_{12}$ between the first contact region 106(1) and the second contact region 106(2) is defined as the distance between the top contacts 122(T) of the contact regions 106(1) and 106(2), and the distance $d_{23}$ between the second contact region 106(2) and the third contact region 106(3) is defined as the distance between the bottom contacts 122(B) of the contact regions 106(2) and 106(3). In some embodiments, as shown in FIG. 1, $d_{i(i+1)} > d_{j(j+1)}$, particularly $d_{i(i+1)}/d_{j(j+1)} > 100$, wherein $d_{j(j+1)} < 10$ µm. That is, $d_{12}$, $d_{34}$, $d_{56}$ and $d_{78}$ are larger than $d_{23}$, $d_{45}$ and $d_{67}$ ($d_{34}$, $d_{45}$, $d_{56}$, $d_{67}$ and $d_{78}$ are not indicated in the figures). In particular, the larger distances may be over 100 times the smaller distances, wherein the smaller distances are less than 10 µm.

Here, due to the shortening of the lengths of the word line layers and the disposition of the plurality of contact regions, the resistance and the capacitance of the word lines can be decreased. As such, the RC delay and the power consumption of the memory structure can be decreased. This is particularly beneficial to the case in which the word line layers are made of doped poly-silicon. Further, a plurality of array regions are disposed between and controlled by a pair of decoders. Compared to the cases in which each array region is provided with a pair of decoders, the number of the decoders can be decreased, and thereby the cost can be decreased.

In addition, since the contact regions are disposed, relative to the array regions, in a symmetrical way, some easier and cheaper processes may be used in the forming of the contact regions. For example, a trimming process, which is an isotropic etch process typically used to form symmetrical structures, may be applied. The trimming process is particularly beneficial to process cost.

Figure 4:
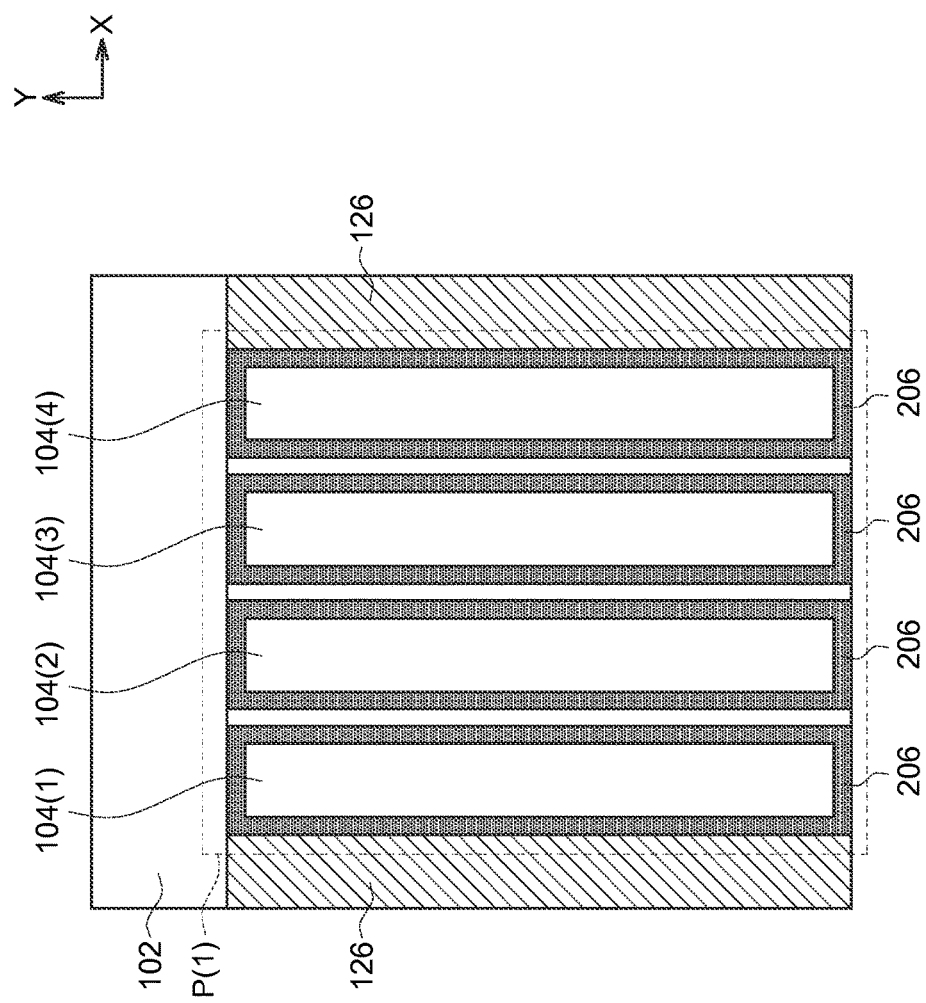
FIG. 4 shows a memory structure according to another embodiment.

Referring to FIG. 4, a memory structure according to another embodiment is shown. This embodiment is different from the embodiment of FIG. 1 in that each of the array regions 104(1) to 104(4) is completely surrounded by a contact region 206. From another aspect of view, every two contact regions are connected to each other so as to surround the corresponding array region. For example, the contact regions 106(1) and 106(2) shown in FIG. 1 are connected to each other and form a contact region 206 surrounding the array region 104(1). The contact regions 106(3) and 106(4) shown in FIG. 1 are connected to each other and form a contact region 206 surrounding the array region 104(2). The contact regions 106(5) and 106(6) shown in FIG. 1 are connected to each other and form a contact region 206 surrounding the array region 104(3). Similarly, the contact regions 106(7) and 106(8) shown in FIG. 1 are connected to each other and form a contact region 206 surrounding the array region 104(4). Such a configuration is more beneficial for the application of a trimming process.

Figure 5:
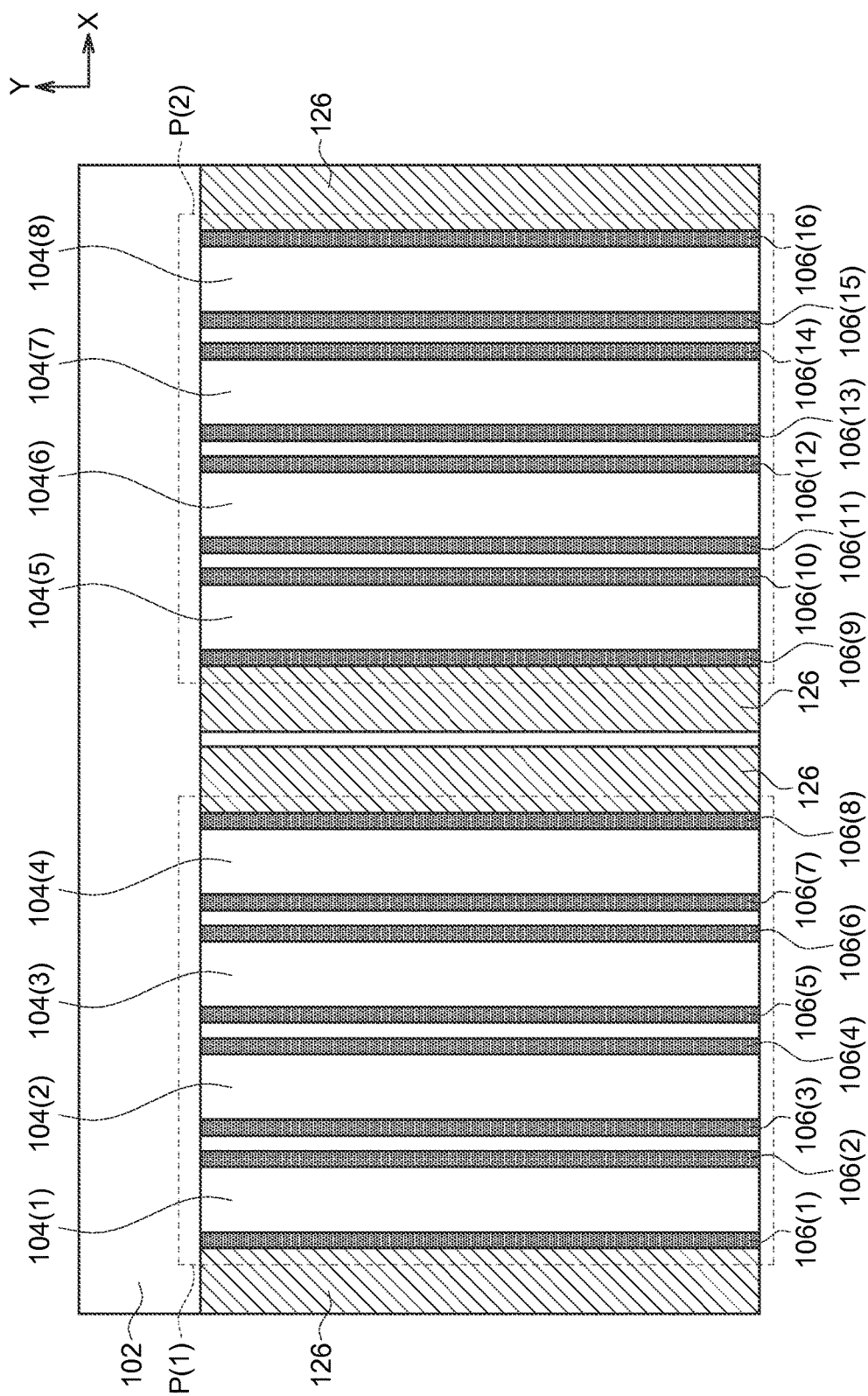
FIG. 5 shows a memory structure according to still another embodiment.

Further, according to some embodiments, the memory structure may have a multi-plane design, such as the embodiment shown in FIG. 5. Here, the term "plane" should not be understood in a spatial manner, but should be understood in an electrical manner. The multi-plane design allows for the reduction of the overhead time. For example, a first command address may be sent firstly, and a first data will be read. During waiting the first data, a second command address may be sent. As such, the time is saved. The memory structure may comprise a plurality of planes, wherein each of the planes comprises at least two array regions and at least two contact regions, which are disposed between two decoders of the memory structure, and wherein two of the at least two array regions which are adjacent to each other are spatially separated by two of the at least two contact regions. For example, in the embodiment shown in FIG. 5, the memory structure comprises two planes P(1) and P(2). The plane P(1) comprises four array regions 104(1) to 104(4) and eight contact regions 106(1) to 106(8), and the plane P(2) comprises four array regions 104(5) to 104(8) and eight contact regions 106(9) to 106(16). Each of the planes P(1) and P(2) has a configuration as illustrated above. That is, in each of the planes P(1) and P(2), two adjacent array regions are spatially separated by two contact regions coupled thereto, respectively.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A memory structure, comprising:
  decoders;
  M array regions, wherein M is an integer ≥2; and

N contact regions, wherein N is an integer ≥M, each of the M array regions is coupled to at least one of the N contact regions, and each of the N contact regions comprises:
a stair structure comprising alternately stacked conductive layers and insulating layers; and
a plurality of contacts, wherein each of the contacts is connected to one of the conductive layers of the stair structure;
wherein two of the M array regions which are adjacent to each other are spatially separated by two of the N contact regions, which are coupled to the two of the M array regions, respectively, the M array regions are spatially separated from each other by the stair structures of the contact regions,
wherein the memory structure comprises a plurality of planes wholly non-overlapping with each other, wherein each of the planes comprises:
at least two of the M array regions and at least two of the N contact regions, wherein the at least two of the M array regions and the at least two of the N contact regions are disposed between two of the decoders, and wherein two of the at least two of the M array regions which are adjacent to each other are spatially separated by two of the at least two of the N contact regions, wherein there are no decoders between any of the M array regions in any of the plurality of planes.

2. The memory structure according to claim 1, wherein the two of the N contact regions are electrically connected to each other but completely spatially separated from each other.

3. The memory structure according to claim 1, wherein the two of the N contact regions are electrically connected to each other but partially spatially separated from each other.

4. The memory structure according to claim 1, wherein N=2M, and every two of the N contact regions are disposed on two sides of corresponding one of the M array regions.

5. The memory structure according to claim 4, wherein the N contact regions has:
a distance $d_{i(i+1)}$ between two of the plurality of contacts connected to top conductive layers of the conductive layers of the stair structures of an $i^{th}$ contact region and an $(i+1)^{th}$ contact region disposed on opposing sides of corresponding one of the M array regions; and
a distance $d_{j(j+1)}$ between two of the plurality of contacts connected to bottom conductive layers of the conductive layers of the stair structures of a $j^{th}$ contact region and a $(j+1)^{th}$ contact region disposed on a side of corresponding another of the M array regions near the corresponding one of the M array regions, wherein i is an odd number from 1 to N−1, and j is an even number from 2 to N−2, the $i^{th}$ contact region, the $(i+1)^{th}$ contact region/the $j^{th}$ contact region and the $(j+1)^{th}$ contact region are arranged in sequence with a number order of i, (i+1)/j, and (j+1), and
wherein $d_{i(i+1)} > d_{j(j+1)}$.

6. The memory structure according to claim 5, wherein $d_{i(i+1)}/d_{j(j+1)} > 100$.

7. The memory structure according to claim 5, wherein $d_{j(j+1)} < 10$ μm.

8. The memory structure according to claim 4, wherein the N contact regions comprise an $i^{th}$ contact region, an $(i+1)^{th}$ contact region, a $j^{th}$ contact region and a $(j+1)^{th}$ contact region, i is an odd number from 1 to N−1, and j is an even number from 2 to N−2, and
wherein the $i^{th}$ contact region and the $(i+1)^{th}$ contact region are disposed mirror-symmetrically, and the $j^{th}$ contact region and the $(j+1)^{th}$ contact region are disposed mirror-symmetrically.

9. The memory structure according to claim 4, wherein the every two of the N contact regions are connected to each other so as to surround the corresponding one of the M array regions.

10. The memory structure according to claim 1, wherein N>3.

11. The memory structure according to claim 1, wherein N>7.

12. The memory structure according to claim 1, wherein each of the M array regions comprises:
a stack comprising alternately stacked conductive layers and insulating layers; and
a plurality of strings penetrating through the stack.

13. The memory structure according to claim 12, wherein the stair structure of each of the N contact regions and the stack of corresponding one of the M array regions are continuously formed.

14. The memory structure according to claim 12, wherein the conductive layers of the stack and the conductive layers of the stair structure are made of heavily-doped silicon.

15. A memory structure, comprising:
decoders;
contact regions each comprising:
a stair structure comprising alternately stacked conductive layers and insulating layers; and
a plurality of contacts, wherein each of the contacts is connected to one of the conductive layers of the stair structure; and
array regions each comprising:
a stack comprising the alternately stacked conductive layers and the insulating layers; and
a plurality of strings penetrating through the stack;
wherein two of the array regions which are adjacent to each other are spatially separated by two of the contact regions, each of the array regions is between corresponding two of the contact regions and shares the same alternately stacked conductive layers and the same insulating layers with the both stair structures of the corresponding two of the contact regions, the array regions are spatially separated from each other by the stair structures of the contact regions,
wherein the memory structure comprises a plurality of planes wholly non-overlapping with each other, wherein each of the planes comprises:
at least two of the array regions and at least two of the contact regions, wherein the at least two of the array regions and the at least two of the contact regions are disposed between two of the decoders, and wherein two of the at least two of the array regions which are adjacent to each other are spatially separated by two of the at least two of the contact regions, wherein there are no decoders between any of the array regions in any of the plurality of planes.

* * * * *